(12) United States Patent
Fakhruddin

(10) Patent No.: US 11,018,130 B1
(45) Date of Patent: May 25, 2021

(54) METHOD TO MITIGATE SIGNAL FEED THROUGH ESD ELEMENTS

(71) Applicant: XILINX, INC., San Jose, CA (US)

(72) Inventor: Mohammed Fakhruddin, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/573,637

(22) Filed: Sep. 17, 2019

(51) Int. Cl.
    *H01L 27/02* (2006.01)
    *H01L 25/065* (2006.01)
    *H01L 23/48* (2006.01)
    *H01L 21/768* (2006.01)

(52) U.S. Cl.
    CPC .... *H01L 27/0292* (2013.01); *H01L 21/76898* (2013.01); *H01L 23/481* (2013.01); *H01L 25/0657* (2013.01); *H01L 2225/06513* (2013.01); *H01L 2225/06544* (2013.01)

(58) Field of Classification Search
    CPC ............ H01L 27/0292; H01L 27/0248; H01L 21/76898; H01L 25/0657; H01L 23/481; H01L 2225/06513; H01L 2225/06544
    See application file for complete search history.

(56) References Cited

U.S. PATENT DOCUMENTS

| | | | |
|---|---|---|---|
| 8,881,085 B1 | 11/2014 | Karp et al. | |
| 9,099,999 B1 * | 8/2015 | Wang | H03K 17/00 |
| 2012/0134193 A1 * | 5/2012 | Ide | G11C 5/04 365/51 |
| 2016/0148907 A1 * | 5/2016 | Segawa | H01L 23/5286 257/369 |

* cited by examiner

*Primary Examiner* — Julio J Maldonado
*Assistant Examiner* — Mohammad A Rahman
(74) *Attorney, Agent, or Firm* — Patterson + Sheridan, LLP

(57) ABSTRACT

An integrated circuit (IC) die is provided, which includes a die body; electrostatic discharge (ESD) circuitry formed in the die body; contact pads exposed on an active side of the die body; a first conductive tower formed in the die body and electrically coupling a first contact pad to the ESD circuitry. The first conductive tower comprises first, second, third, and fourth segments formed from metal layers of the die body; a first via electrically coupling the first segment to the second segment; a second via electrically coupling the first segment to the third segment; a third via electrically coupling the second segment to the fourth segment; and a fourth via electrically coupling the third segment to the fourth segment, the second segment electrically parallel with the third segment. The IC die further comprises at least a first data line disposed between the first, second, third, and fourth segments.

20 Claims, 6 Drawing Sheets

METHOD TO MITIGATE SIGNAL FEED THROUGH ESD ELEMENTS

TECHNICAL FIELD

Examples of the present disclosure generally relate to semiconductor devices and, in particular, to mitigating signal feed through electrostatic discharge (ESD) elements in an integrated circuit (IC) assembly.

BACKGROUND

Electronic devices, such as tablets, computers, copiers, digital cameras, smart phones, control systems and automated teller machines, among others, often employ electronic components which leverage integrated circuit (IC) package assemblies for increased functionality and higher component density. To prevent damage to the integrated circuits, the dies typically include circuitry for electrostatic discharge (ESD) protection. In most conventional applications, an IC die includes ESD routing that provides a low resistive path from solder bumps on the package substrate down to active circuitry of the IC die. Conventional ESD protection circuits also include guard rings that surrounding ESD circuitry and provide electrical isolation of the ESD circuitry. However, because of this arrangement, the ESD circuitry and the guard rings affect the operation and placement of other components of the IC package assembly.

SUMMARY

Techniques for mitigating signal feed through electrostatic discharge (ESD) elements are described herein that include a die having ESD circuitry. In an example, an integrated circuit die includes a die body having an active side and a backside; electrostatic discharge (ESD) circuitry formed in the die body; a first contact pad and a second contact pad exposed on the active side of the die body; a first conductive tower formed in the die body and electrically coupling the first contact pad to the ESD circuitry. The first conductive tower comprises first, second, third, and fourth segments formed from metal layers of the die body; a first via electrically coupling the first segment to the second segment; a second via electrically coupling the first segment to the third segment; a third via electrically coupling the second segment to the fourth segment; and a fourth via electrically coupling the third segment to the fourth segment, the second segment electrically parallel with the third segment. The IC die further comprises at least a first data line disposed between the first, second, third, and fourth segments.

In another example, an integrated circuit die comprises a die body having an active side and a backside; electrostatic discharge (ESD) circuitry formed in the die body; a first contact pad and a second contact pad exposed on the active side of the die body; a first conductive tower formed in the die body and electrically coupling the first contact pad to the ESD circuitry; a second conductive tower formed in the die body and electrically coupling the second contact pad to the ESD circuitry; and at least a first data line disposed between the first conductive tower and the second conductive tower, wherein the first data line is directly adjacent to the first adjacent tower.

In another example, a method for manufacturing an integrated circuit (IC) die is disclosed. The method comprises forming the IC die with an active side, a backside, a plurality of through-silicon vias (TSVs) exposed on the backside, and an electrostatic discharge (ESD) circuitry on the active side; forming a first conductive tower in the die body, the first conductive tower comprising: first, second, third, and fourth segments formed from metal layers of the die body; a first via electrically coupling the first segment to the second segment; a second via electrically coupling the first segment to the third segment; a third via electrically coupling the second segment to the fourth segment; and a fourth via electrically coupling the third segment to the fourth segment, the second segment electrically parallel with the third segment. The method further includes while forming the first conductive tower in the die body, forming at least a first data line in the die body, the first data line disposed between the first, second, third, and fourth segments.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
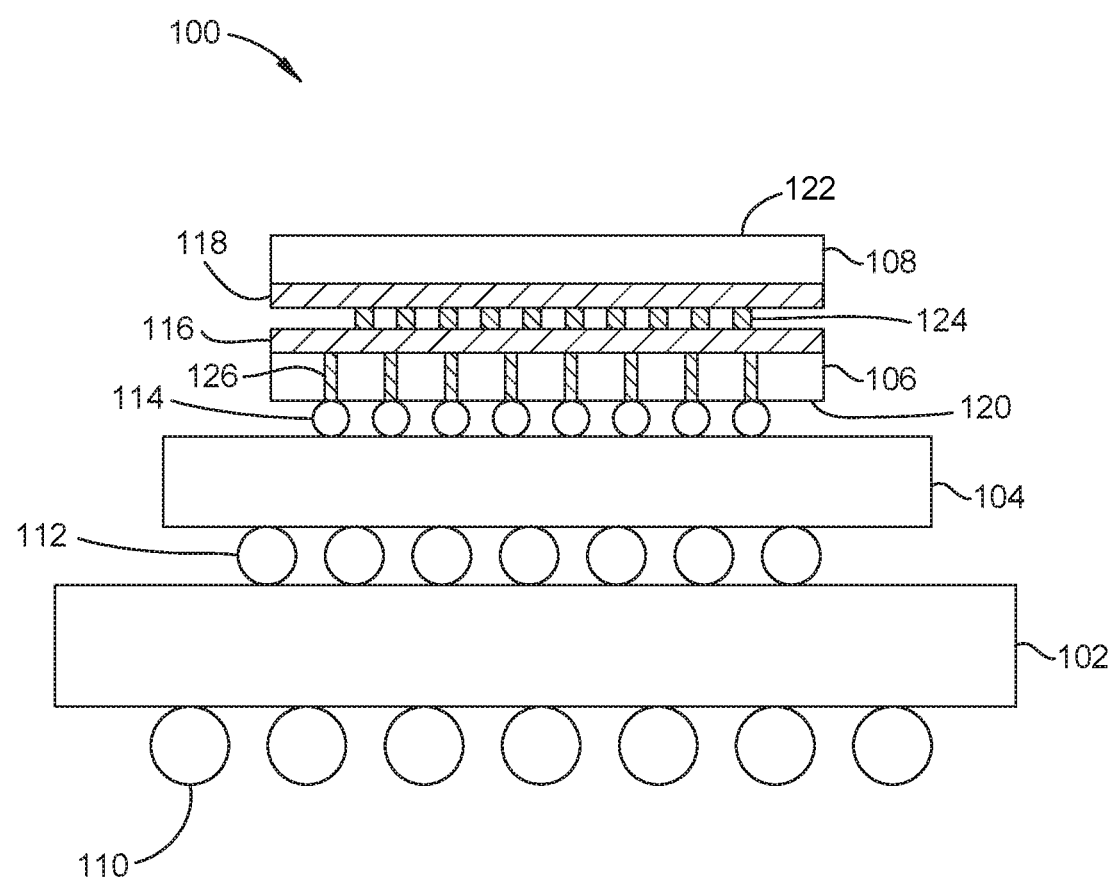
FIG. 1 is a cross-section view of a stacked chip package assembly that includes a non-I/O die stacked on an I/O die, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. An aspect or an advantage described in conjunction with a particular example is not necessarily limited to that example and can be practiced in any other examples even if not so illustrated or if not so explicitly described.

Techniques for mitigating signal feed through electrostatic discharge (ESD) elements in a stacked integrated circuit assembly are described herein. In examples, an integrated circuit die includes a die body having an active side and a back side. ESD discharge circuitry is formed in the die body, and first and second contact pads are exposed on the active side of the die body. A first conductive tower is formed in the die body, and electrically couples the first contact pad to the ESD circuitry. The first conductive tower comprises a first segment, a second segment, a third segment, and fourth segment formed from metal layers of the die body. The first conductive tower also comprises a first via electrically coupling the first segment to the second segment, a second via electrically coupling the first segment to the third segment, a third via electrically coupling the second segment to the fourth segment, and a fourth via electrically coupling the third segment to the fourth segment. The second segment of the first conductive tower is also electrically parallel with the third segment. At least one data line is disposed between the first, second, third, and fourth segments of the first conductive tower.

Because data lines can pass between metal segments of the metal layers of a conductive tower electrically coupled to the ESD circuitry, data lines can be placed and routed through the ESD elements and thereby allow more arrangements of the data lines. Further, because data lines can pass through and between conductive towers electrically coupled to the ESD circuitry, ESD circuitry can be used in dense interconnect areas of ICs and other areas of the IC, and thereby allow greater flexibility in the placement and routing of data lines through the IC. Additionally, long routing of data lines are minimized because the arrangement of data lines as described creates a "shortcut" while still meeting the ESD routing rules. Accordingly, better performing and simpler dies can be realized as compared to traditional ESD and routing techniques.

FIG. 1 is a cross-section view of a stacked chip package assembly that includes a non-I/O die stacked on an I/O die, according to an example. The stacked chip package 100 includes substrate, a first integrated circuit (IC) die 106, and a second IC die 108. The second die 108 is stacked on the first die 106. The stacked combination of the dies 106, 108 is mounted on the substrate. In one example, the substrate may be a package substrate 102. In another example and as depicted in FIG. 1, the substrate is an interposer substrate 104 that is mounted on a package substrate 102 to form the package 100. The IC dies 106, 108 are electrically and mechanically connected to one another. The stacked combination of the dies 106, 108 is electrically and mechanically connected to the interposer substrate 104. The interposer substrate 104 is electrically and mechanically connected to the package substrate 102. The package substrate 102 can be electrically and mechanically connected to a substrate external to the chip package 100, such as a printed circuit board (PCB) not shown in FIG. 1.

The package substrate 102 can be any suitable type organic substrate, inorganic substrate, or the like. The package substrate 102 includes a plurality of solder balls 110 that provide external electrical contacts for the stacked chip package 100. The interposer substrate 104 can be any suitable type of organic substrate, inorganic substrate, or the like. The interposer substrate 104 includes a plurality of solder bumps 112 (e.g., C4 bumps). The package substrate 102 includes metallization (not shown) that electrically connects the solder balls 110 to the solder bumps 112. The IC dies 106, 108 can include a semiconductor substrate, such as silicon or the like. The first die 106 includes a plurality of solder bumps (e.g., microbumps). The interposer substrate 104 includes metallization (not shown) that electrically connects the solder bumps 112 to the solder bumps 114.

The first die 106 further includes through-silicon vias (TSVs) 126 and an active side 116. The TSVs 126 extend between a backside 120 of the first die 106 and the active side 116. The active side 116 includes active circuitry and metallization (shown in FIG. 2). The TSVs 126 electrically connect the solder bumps 114 to the active side 116. The second die 108 further includes a backside 122 and an active side 118. The active side 118 includes active circuitry and metallization (not shown). The active side 116 is electrically coupled to the active side 118 by contacts 124, such as metal pillars, solder bumps, or the like.

In the example of FIG. 1, the second die 108 is electrically and mechanically mounted to the first die 106 by the contacts 124. The first die 106 is electrically and mechanically mounted to the interposer substrate 104 by the solder bumps 114. The interposer substrate 104 is electrically and mechanically mounted to the package substrate 102 by the solder bumps 112. The package substrate 102 can be electrically and mechanically mounted to an external substrate (not shown), such as a PCB by the solder balls 110. The stacked IC assembly can optionally include various other elements which have been omitted for clarity, such as underfill, a lid, and the like.

The stacked chip package 100 can also include other variations than the example shown in FIG. 1. In the example, the IC dies 106, 108 are stacked face-to-face (e.g., active side to active side). The "active side" as used herein refers to the side of a silicon substrate on which the active devices (i.e., transistors, capacitors and the like) are fabricated, as opposed to the "backside" of the silicon substrate. In other examples, the IC dies 106, 108 can be stacked face side to backside (e.g., the active side 118 of the second die 108 can be mounted to the backside 120 of the first die 106, and the active side 116 of the first die 106 can be mounted on the interposer substrate 104). In either example, the first die 106 includes TSVs 126 to provide electrical pathways between the backside 120 and the active side 116. In another example and as mentioned above, the interposer substrate 104 can be omitted and the stacked combination of the first die 106 and the second die 108 can be mounted directly to the package substrate 102. In the example shown, the stacked chip package 100 includes two IC dies 106 and 108. However, the stacked chip package 100 can include more than two IC dies. For example, three or more IC dies can be mounted to form a single die stack. In another example, multiple stacks of IC dies can be mounted on the interposer substrate 104 in a side-by-side arrangement.

Electrical charge can build up at various interfaces between the substrates in the stacked chip package 100. For example, charge can accumulate on the solder balls 110, at the semiconductor substrate of the second die 108, and at the internal nodes of the circuitry of the IC dies 106, 108. Such charges can discharge through the circuitry of the IC dies 106, 108 (referred to as electrostatic discharge (ESD)). Thus, the IC dies 106, 108 can include ESD protection circuitry therein to protect charge-sensitive circuitry from ESD. In particular, the IC die 106 can include ESD protection circuitry formed on the active side 116.

Figure 2:
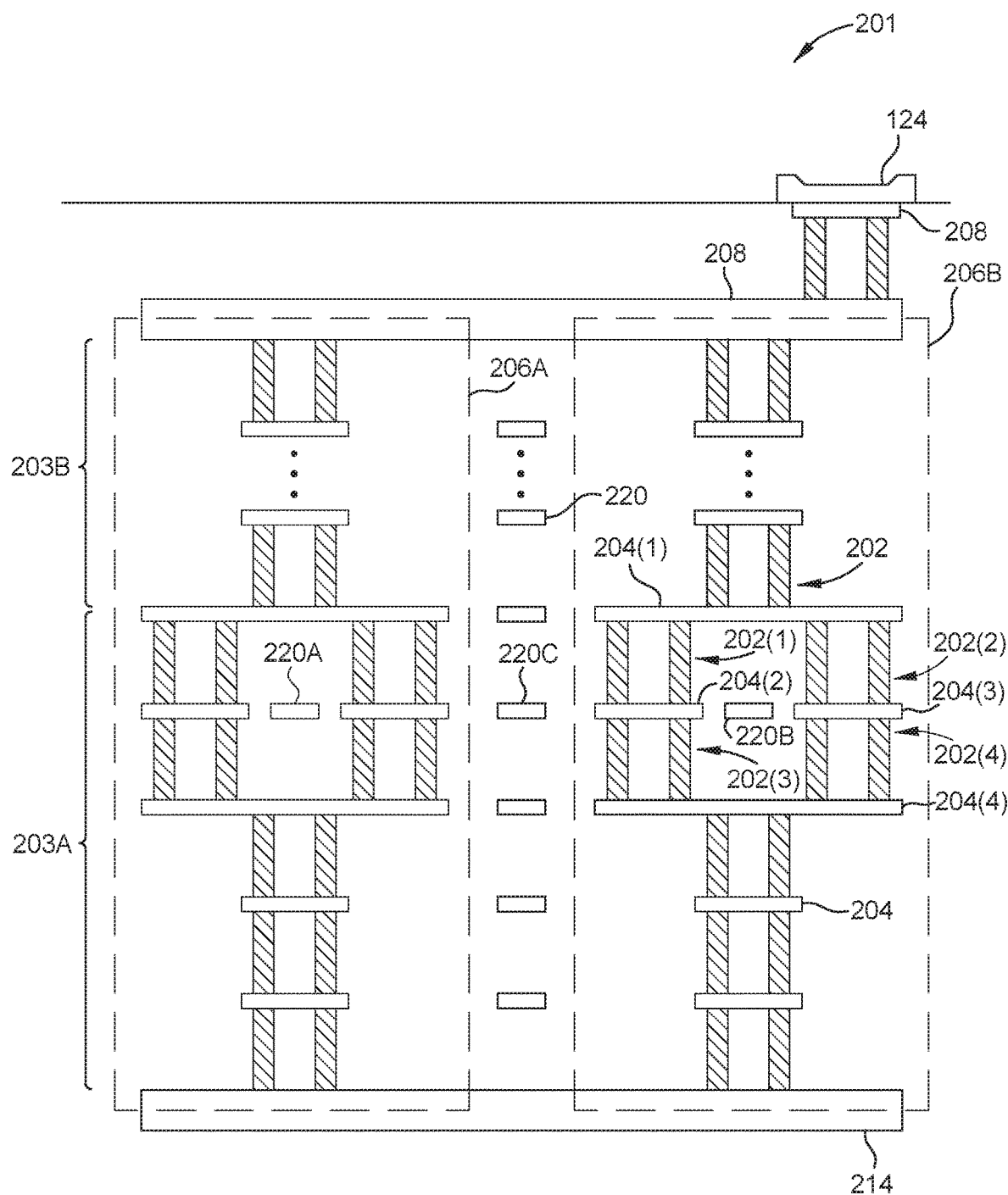
FIG. 2 is a cross-section showing the IC die in more detail, according to an example.

FIG. 2 is a cross-section showing the IC die 106 in more detail, according to an example. The IC die 106 includes ESD circuitry 214 formed in the semiconductor substrate (e.g., transistors, diodes, capacitors, etc.). In one example, the ESD circuitry 214 comprises a diode. In the example, the first die 106 includes metallization 201 formed on the active side 116 thereof. In general, the metallization 201 includes a first plurality of metal layers 203A and a second plurality of metal layers 203B (generally metal layers 203). The first plurality of metal layers 203A is formed on the semiconductor substrate and is nearest the semiconductor substrate. The second plurality of metal layers 203B is formed on the first plurality of metal layers and is farthest from the semiconductor substrate. In general, the metallization 201 can include any number of metal layers, and each plurality 203A and 203B can include any numbers of metal layers. Further, in general, metal layers nearest the substrate of the first die 106 are thinner than metal layers farther from the substrate of the first die 106. Thus, the metal layers in the plurality of metal layers 203A are thinner than the metal layers in the plurality of metal layers 203B, which is omitted for clarity. A metal segment 208 is the metal layer farthest from the substrate of the IC die 106 and is formed in the plurality of metal layers 203B.

In the example, the metallization 201 includes towers 206A and 206B (generally towers 206). Each tower 206 is formed in the first plurality of metal layers 203A (e.g., the thinner metal layers) and the second plurality of metal layers 203B (e.g., the thicker metal layers). In the example, the towers 206A and 206B are electrically connected to the ESD circuitry 214 and are disposed on the ESD circuitry 214. In the example, each tower 206 includes a vertical stack of vias 202 (including vias 202(1)-(4)) (generally referred herein as vias 202) and metal segments 204. A metal segment 208 is the metal layer farthest from the second die 108 and is formed in the plurality of metal layers 203. In the example, each of the towers 206 is electrically coupled to a metal segment 208 in the plurality of metal layers 203. In one example, the metal segments 204 of each tower 206 are electrically parallel to each other. For example, each metal segment 204 is parallel to another metal segment 204 of each tower 206. Some metal layers 203 of the towers 206 can comprise more than one metal segment 204, so that a metal segment 204 of one metal layer 203 is electrically coupled to at least two segments of another layer of the same tower 206. While FIG. 2 illustrates only two towers 206 electrically connected to the ESD circuitry 214, the IC die 106 can have any number of towers electrically connected to the ESD circuitry 214 or other ESD circuitry not shown.

In the example, the IC die 106 also includes data lines 220 (including data lines 220A, 220B, 220C) (generally referred herein as data lines 220) routed between the metal segments 204. In some examples, the data lines 220 can pass between metal segments 204 comprising a single tower 206. In other examples, data lines 220 may additionally or alternatively pass between two adjacent towers 206. The data lines 220 are parallel with the metal segments 204, and are disposed between some of the metal segments. In some examples, a data line passes between metal segments above, below, left, and right. For example, data line 220 is disposed between two metal segments 204 of one metal layer, and is electrically parallel to two metal segments on different metal layers, each on a metal layer different from the other and not the same layer as the data line. More than one data line can pass between metal segments of the towers 206. In some examples, more than one data line 220 is disposed between two metal segments 204 of the same metal layer. The IC die 106 can have any arrangement of data lines passing between metal segments 204 of the towers 206. In some examples, the data lines 220 include interconnect data lines.

In some examples, the data lines 220 pass between the towers 206 and are directly adjacent to at least one of the towers 206. For example, data lines 220 can be disposed directly adjacent to the metal segments of tower 206A without a guard ring disposed between the data lines 220 and the tower 206A. In one example, the IC 106 does not include a guard ring around the towers 206. The lack of a guard ring around the towers 206 opens space for routing data lines 220 closer to the towers 206, and opens more area to route data lines within the IC 106. This open space and area also permits shorter and more direct data line routing within the IC 106.

The IC die 106 can have any number of data lines (e.g., data line 220A and 220B) passing between the towers 206. The die 106 can have multiple data lines 220 in a single metal layer between the towers 206. For example, FIG. 2 illustrates a wall of data lines 220 (including data line 220C) between the towers 206A and 206B, and in some examples, any number of walls of data lines 220 can be disposed between the towers 206A and 206B. The IC die 106 can have any arrangement of data lines 220 passing between the towers 206.

In one example, the IC die 106 comprises a first conductive tower (e.g., tower 206A) formed in the die body. The tower 206 electrically couples the contact pad 124 to the ESD circuitry 214. The conductive tower 206 comprises first segment 204(1), second segment 204(2), third segment 204(3), and fourth segment 204(4) formed from metal layers of the die body. The second segment 204(2) is electrically parallel with the third segment 204(3). A first via 202(1) electrically couples the first segment 204(1) to the second segment 204(2). A second via 202(2) electrically couples the first segment 204(1) to the third segment 204(3). A third via 202(3) electrically couples the second segment 204(2) to the fourth segment 204(4). A fourth via 202(4) electrically couples the third segment 204(3) to the fourth segment 204(4). Accordingly, at least a first data line 220 disposed between the first segment 204(1), second segment 204(2), third segment 204(3), and fourth segment 204(4) so that the first data line 220B passes through the first conductive tower 206B.

In another example, two data lines 220 can be disposed between metal segments 204 of a single tower 206 (e.g., tower 206B) and formed on adjacent metal layers 203 to each other. In such example, two data lines 220 are formed in adjacent metal layers 203, so that each data line 220 is in a different metal layer 203. Each of the two data lines 220 are disposed between metal segments 204 of the respective metal layer 203, and the metal segments 204 and data lines 220 of the two adjacent metal layers 203 are electrically parallel to a pair of metal segments. For example, where a first data line 220 is disposed between a first segment 204(1), second segment 204(2), third segment 204(3), and fourth metal segment 204(4), a fifth metal segment is coupled between the first segment 204(1) and second segment 204(2) and is disposed electrically in series with the second segment 204(2). Further, a sixth segment is coupled between the first segment 204(1) and the third segment 204(3), and is disposed electrically in series with the second segment 204(2). The second data line is disposed between the fifth and sixth segment, such that the second data line, the fifth segment, and the sixth segments are formed in a common metal layer of the die body.

In some examples, immediately adjacent metal segments 204 are separated by dielectric material but are still considered adjacent for the examples described herein. As used herein, immediately adjacent metal segments refer to metal segments with no intervening metal such that dielectric material separates two immediately adjacent metal segments. For example, the second segment 204(2) and third segment 204(3) are considered immediately adjacent and co-planar despite being separated by dielectric material. Similarly, a data line 220 can be considered immediately adjacent and co-planar with another data line or with a metal segment 204. For example, data line 220B can be considered immediately adjacent and co-planar with the second metal segment 204(2) and the third metal segment 204(3), despite being separated by dielectric material.

In some examples, data lines 220 can be disposed on a layer disposed between two metal layers. For example, a data line can be disposed between metal segments of different metal layers (e.g., the first metal segment 204(1) and the fourth metal segment 204(4)), while being immediately adjacent to and coplanar with vias connecting the metal segments of the tower. In such example, the data line is disposed between at least two vias and is co-planar with the two vias. In another example, the data line is disposed between the first conductive tower 206A and the second conductive tower 206B, such as data line 220C, and is coplanar with vias of the towers 206.

Figure 3:
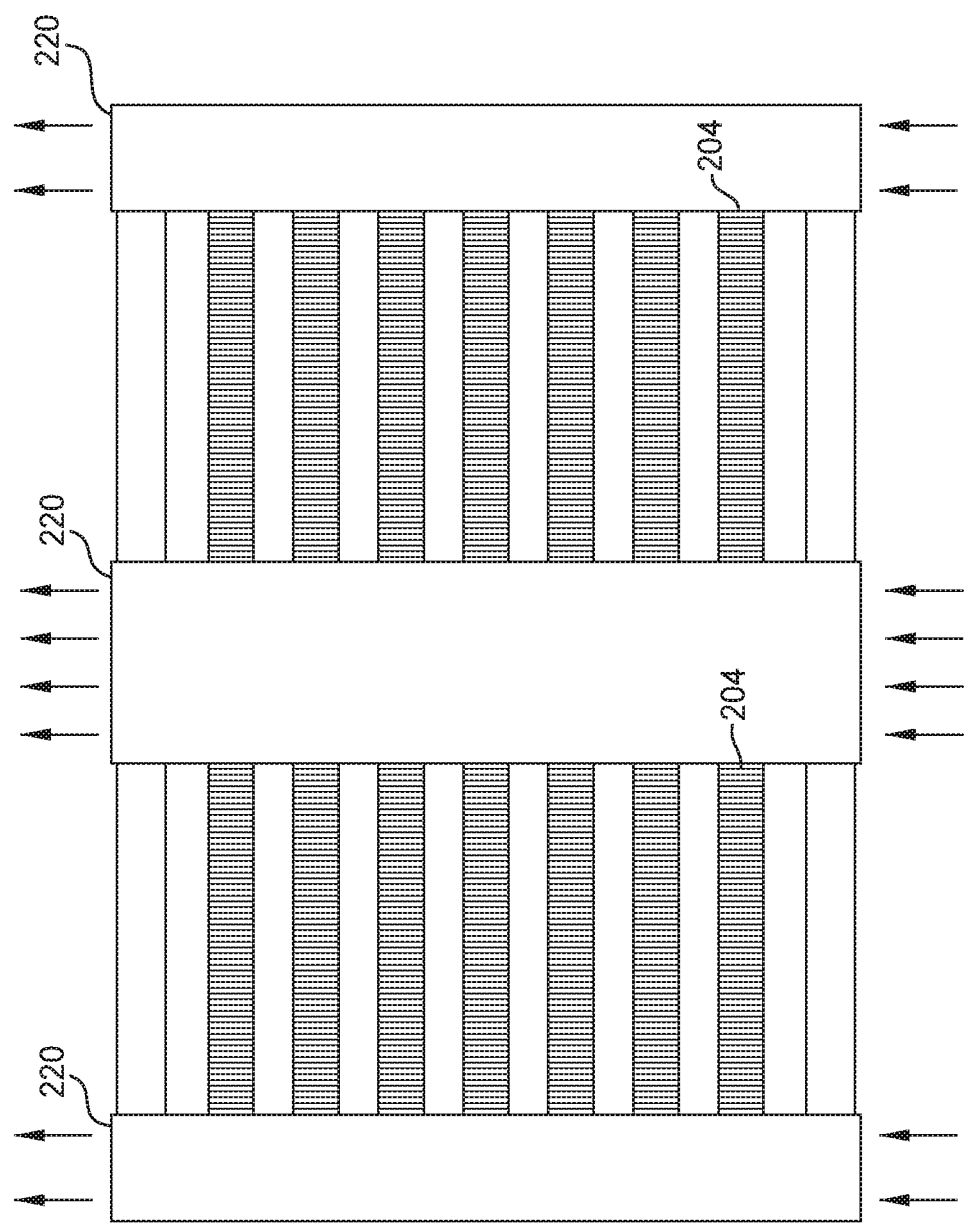
FIG. 3 is a top view of the IC die, according to an example.

FIG. 3 is a top view of the IC die 106 having data lines 220 passing through the ESD circuitry 214, according to an example. Specifically, FIG. 3 shows the areas for the data lines 220 to pass through the IC die 106 between the towers 206. In one example, the data lines 220 are disposed immediately adjacent to the metal segments of the towers 206 without an intervening guard ring segment. Conventional guard rings prevent data lines from passing through towers coupled to ESD circuitry (e.g., ESD circuitry 214) of an IC die, and cause longer routing of data lines around the guard rings. Without the intervening guard ring and segments thereof, IC designers have more flexibility for placing and routing data lines 220. For example, IC designers can place and route ESD circuitry 214 in dense interconnect areas of the IC die 106 while by abiding ESD circuitry rules because the data lines 220 can pass through towers 206 of ESD circuitry 214 unimpeded by intervening guard rings.

Figure 4:
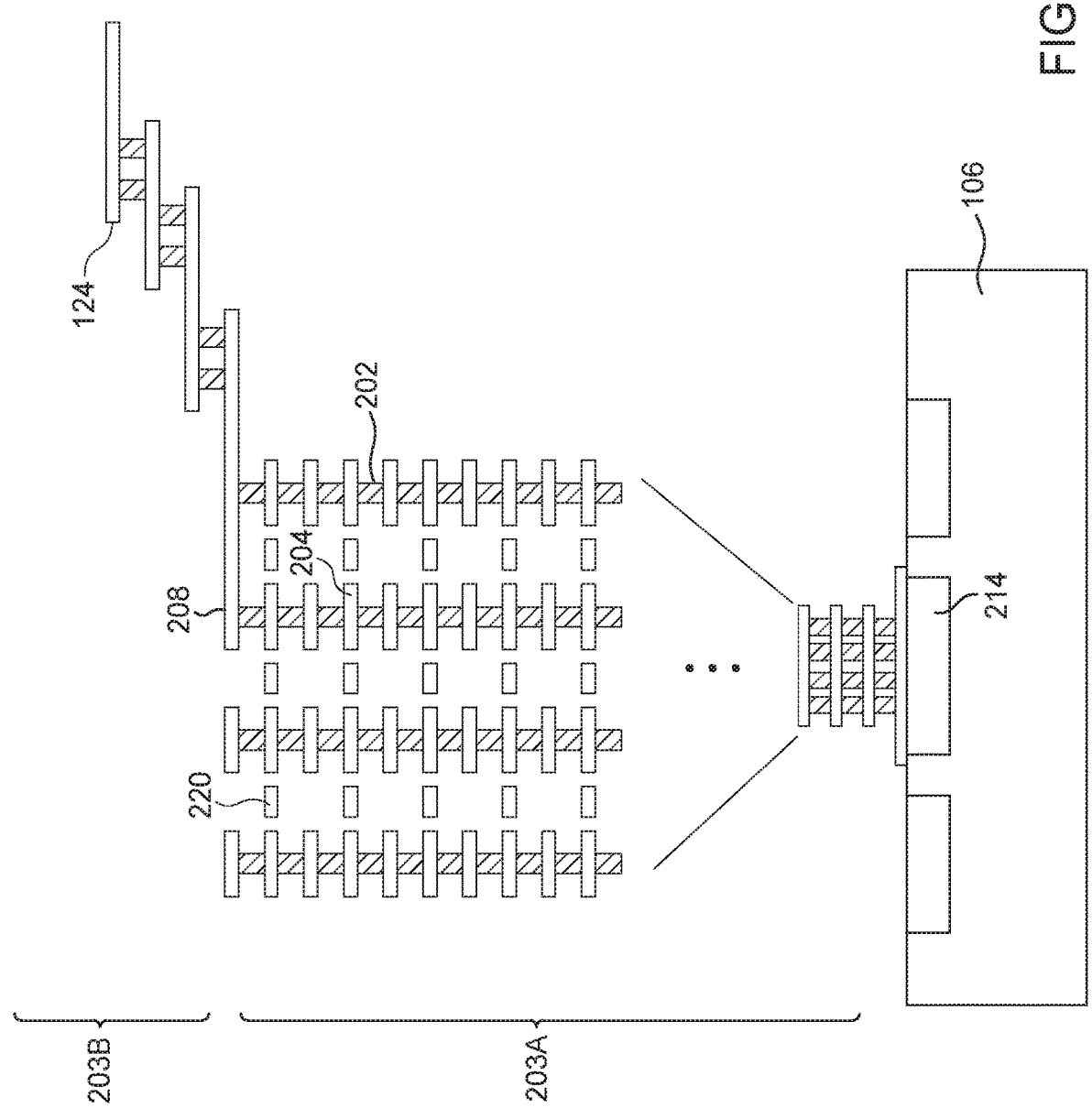
FIG. 4 is a cross-section showing the IC die, according to another example.

FIG. 4 is another cross-section showing the IC die 106 having data lines pass through and between the towers 206 disposed on the ESD circuitry 214, according to another example. Like with FIG. 2, FIG. 4 illustrates the towers 206 of metal segments 204 formed from metal layers 203, and data lines 220 passing between the metal segments 204 of a single tower 206 and between adjacent towers 206. FIG. 4 further illustrates that data lines 220 may be disposed between the towers 206 along with the data lines 220 passing through the towers 206. In such example, the data lines 220 can form a wall of data lines, similar to the arrangement of data lines between towers 206A and 206B, and the wall of data lines can be disposed in the towers 206, as illustrated in FIG. 4.

Figure 5:
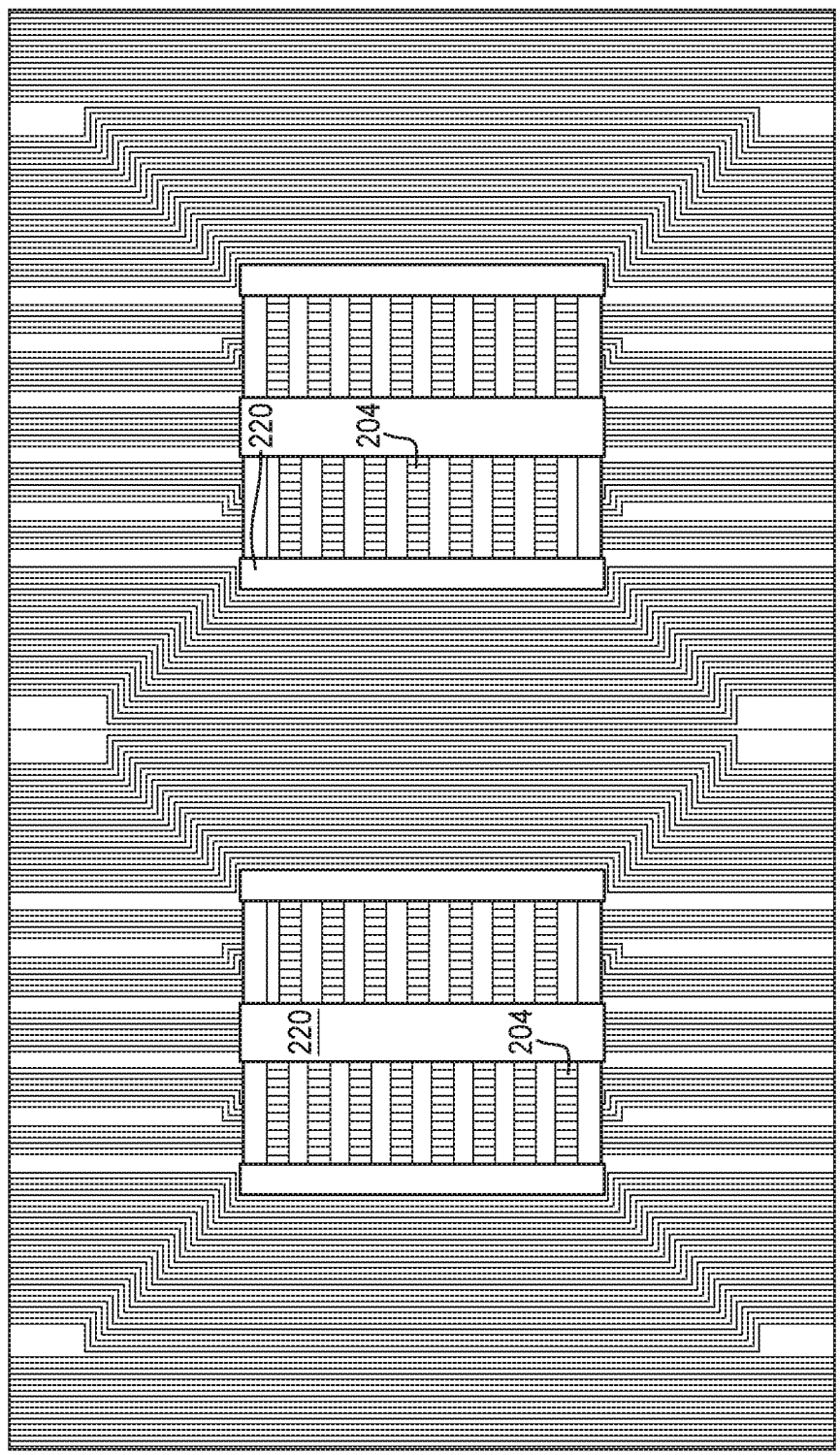
FIG. 5 is a top view of the IC die, according to an example.

FIG. 5 is a top view of the IC die 106 and illustrates the data lines 220 passing between the towers 206 in the metallization of the IC die 106, according to an example. The top view of FIG. 5 shows the placement and routing of the data lines 220 in the IC 106 and more clearly illustrate that the data lines 220 pass around and pass through towers 206 of the IC 106 while FIG. 4 shows the arrangement of the data lines 220 between the metal segments of the towers 206. Because the data lines 220 pass around the towers 206 of the IC 106, ESD circuitry 214, through which data lines 220 can pass, can be placed in higher interconnect areas of the IC 106.

Figure 6:
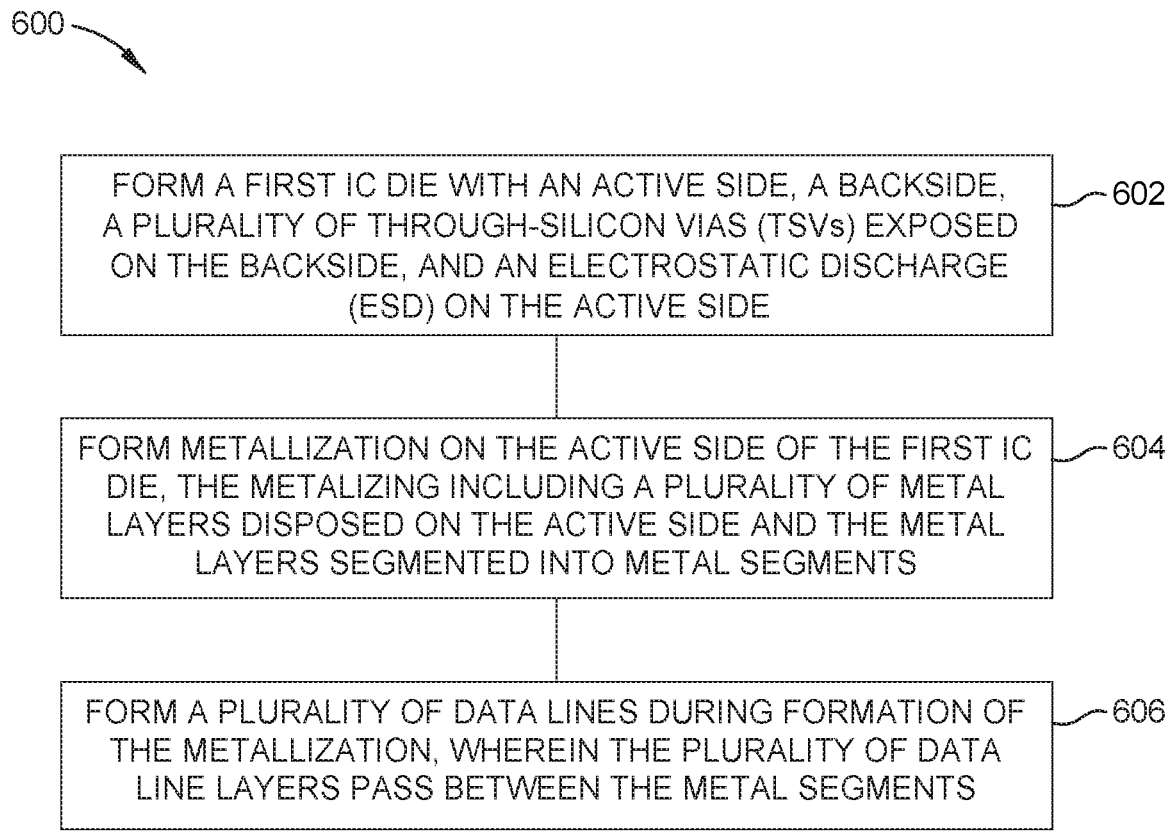
FIG. 6 is a flow diagram depicting a method of manufacturing a stacked chip package assembly, according to an example.

FIG. 6 is a flow diagram depicting a method of manufacturing a stacked IC assembly, such as the chip package 100 described above, according to an example. The method 600 can be performed by one or more semiconductor manufacturing tools. At operation 602, an IC die 106 is formed with an active side, a backside, TSVs exposed on the backside, and ESD circuit(s) on the active side. For example, FIG. 2 shows an example IC die 106 having TSVs 126 and ESD circuit 214. In one example, the ESD circuitry comprises at least a first diode.

At operation 604, a first conductive tower is formed in the IC die 106. In some examples, forming the first conductive tower includes forming a first, second, third, and fourth segment in the metal layers of the die body, with the first segment formed in a first metal layer, the second and third segment electrically parallel to each other and formed in a second metal layer, and the fourth segment formed in a third metal layer. First, second, third, and fourth vias are also formed which electrically couple the segments together. In one example, the first via electrically couples the first segment to the second segment, the second via electrically couples the first segment to the third segment; the third via electrically couples the second segment to the fourth segment, and the fourth via electrically couples the third segment to the fourth segment. The first, second, third, and fourth segments can be either metal segments from metal layers 203A or 203B, or any combination of the metal layers 203.

In some examples, a second conductive tower can be formed while forming the first conductive tower. In some examples, the second conductive tower can have metal segments arranged to form a similar structure as the first conductive tower. Any number of conductive towers can be formed in the IC die 106 and disposed on the ESD circuitry.

At operation 606, while the first conductive tower of the IC die 106 is formed, a plurality of data lines is formed between the segments of the metal layers. In such example, the data lines are formed between metal segments of the first conductive tower so that the data line is disposed on the same metal layer as one of the metal segments comprising the tower 206. Data lines can additionally or alternatively be formed between the first conductive tower and the second conductive tower, wherein no guard ring is present between the one of the data lines and one of the towers. Data lines can be formed between any pair of metal segments of the conductive tower, and more than one data line can pass through the first conductive tower. In one example, a second data line can be formed immediately adjacent to the first side of the third segment and adjacent to the first data line.

In some examples, while forming the second conductive tower, and concurrently, a second data line can be formed between the first conductive tower and the second conductive tower, wherein no guard rings are present adjacent to the one of the data lines and one of the towers. The second data line can be formed in the second metal layer, so that the first data line is formed on a first side of the second segment and the second data line is formed and disposed on a second side opposite of the first side of the second segment.

In one example, a fifth segment and a sixth segment of the first conductive tower are formed. In such example, the fifth segment is coupled to the first and second segments and is disposed electrically in series with the second segment. Also, the sixth segment is coupled between the first and the third segment. A second data line is formed between the fifth and sixth segment, so that the second data line, the fifth segment, and the sixth segment are formed in a common metal layer of the die body.

While the foregoing is directed to specific examples, other and further examples may be devised without departing from the basic scope thereof, and the scope thereof is determined by the claims that follow.

What is claimed is:

1. An integrated circuit die comprising:
a die body having an active side and a backside;

electrostatic discharge (ESD) circuitry formed in the die body;
a first contact pad exposed on the active side of the die body;
a first conductive tower formed in the die body and electrically coupling the first contact pad to the ESD circuitry, the first conductive tower comprising:
first, second, third, and fourth segments formed from metal layers of the die body;
a first via electrically coupling the first segment to the second segment;
a second via electrically coupling the first segment to the third segment;
a third via electrically coupling the second segment to the fourth segment; and
a fourth via electrically coupling the third segment to the fourth segment, the second segment electrically parallel with the third segment; and
a first data line disposed between the first, second, third, and fourth segments.

2. The integrated circuit die of claim 1, further comprising:
a second conductive tower formed in the die body and electrically coupling a second contact pad to the ESD circuitry, the second conductive tower disposed adjacent to the first conductive tower; and
wherein the first data line passes between the first conductive tower and the second conductive tower and the first data line is directly adjacent to the first conductive tower.

3. The integrated circuit die of claim 2, wherein a guard ring is not present between the first conductive tower and the second conductive tower.

4. The integrated circuit die of claim 1, wherein the first data line is directly adjacent a first side of the second segment.

5. The integrated circuit die of claim 4, further comprising:
a second data line disposed adjacent to a second side of the second segment, the first and second data lines formed in a common metal layer of the die body.

6. The integrated circuit die of claim 1, further comprising:
a second data line disposed directly adjacent to a first side of the third segment, the first and second data lines formed in a common metal layer of the die body.

7. The integrated circuit die of claim 1, further comprising:
a fifth segment coupled between the first and second segments, the fifth segment disposed electrically in series with the second segment;
a sixth segment coupled between the first and third segment; and
a second data line disposed between the fifth and sixth segment, the second data line, and the fifth and sixth segments formed in a common metal layer of the die body.

8. An integrated circuit die, comprising:
a die body having an active side and a backside;
electrostatic discharge (ESD) circuitry formed in the die body;
a first contact pad and a second contact pad exposed on the active side of the die body;
a first conductive tower formed in the die body and electrically coupling the first contact pad to the ESD circuitry;
a second conductive tower formed in the die body and electrically coupling the second contact pad to the ESD circuitry; and
a first data line disposed between the first conductive tower and the second conductive tower, wherein the first data line is directly adjacent to the first conductive tower.

9. The integrated circuit die of claim 8, wherein the first data line is co-planar with some vias of the first conductive tower.

10. The integrated circuit die of claim 8, wherein the first data line is directly adjacent to the second conductive tower.

11. The integrated circuit die of claim 8, wherein the first data line is formed in a common metal layer as a first metal segment of the first conductive tower and a second metal segment of the second conductive tower.

12. The integrated circuit die of claim 8, further comprising:
a second data line disposed between the first conductive tower and the second conductive tower, the first data line disposed on a first layer and the second data line disposed on a second layer, the first layer parallel to the second layer.

13. The integrated circuit die of claim 8, wherein a guard ring is not present between the first conductive tower and the second conductive tower.

14. The integrated circuit die of claim 8, wherein a second data line directly adjacent to a first side of the first data line is disposed between the first data line and the first conductive tower.

15. A method for manufacturing an integrated circuit (IC) die, the method comprising:
forming the IC die with an active side, a backside, a plurality of through-silicon vias (TSVs) exposed on the backside, and an electrostatic discharge (ESD) circuitry on the active side;
forming a first conductive tower in the die, the first conductive tower comprising:
first, second, third, and fourth segments formed from metal layers of the die body;
a first via electrically coupling the first segment to the second segment;
a second via electrically coupling the first segment to the third segment;
a third via electrically coupling the second segment to the fourth segment; and
a fourth via electrically coupling the third segment to the fourth segment, the second segment electrically parallel with the third segment; and
while forming the first conductive tower in the die body, forming a first data line in the die body, the first data line disposed between the first, second, third, and fourth segments.

16. The method of claim 15, further comprising: forming a second conductive tower in the die, the second conductive tower disposed adjacent to the first conductive tower; and
while forming the second conductive tower in the die, forming a second data line between the first conductive tower and the second conductive tower, the second data line formed on a first metal layer, the first metal layer having one metal segment of the first conductive tower and one metal segment of the second conductive tower.

17. The method of claim 16, wherein a guard ring does not pass between the first conductive tower and the second conductive tower.

18. The method of claim 15, wherein the data line is directly adjacent to a first side of the second segment.

19. The method of claim 15, further comprising:
forming a second data line directly adjacent to a first side of the third segment, the first and second data lines formed in a common metal layer of the die.

20. The method of claim 15, wherein the first conductive tower further comprises:
a fifth segment coupled between the first and second segments, the fifth segment disposed electrically in series with the second segment; and
a sixth segment coupled between the first and third segment; and
the method further comprising:
forming a second data line between the fifth and sixth segments, the second data line and the fifth and sixth segments formed in a common metal layer of the die.

* * * * *